(12) United States Patent
Sivero

(10) Patent No.: US 8,625,358 B2
(45) Date of Patent: Jan. 7, 2014

(54) ROW DRIVER CIRCUIT FOR NAND MEMORIES INCLUDING A DECOUPLING INVERTER

(76) Inventor: Stefano Sivero, Capriate San Gervasio (IT)

(*) Notice: Subject to any disclaimer, the term of this patent is extended or adjusted under 35 U.S.C. 154(b) by 178 days.

(21) Appl. No.: 13/245,358

(22) Filed: Sep. 26, 2011

(65) Prior Publication Data

US 2013/0077412 A1     Mar. 28, 2013

(51) Int. Cl.
*G11C 16/06*     (2006.01)

(52) U.S. Cl.
USPC ............. 365/185.23; 365/189.09; 365/230.06

(58) Field of Classification Search
USPC ............. 365/185.23, 189.09, 189.11, 230.06, 365/226
See application file for complete search history.

(56) References Cited

U.S. PATENT DOCUMENTS

| | | | | |
|---|---|---|---|---|
| 5,633,832 A | * | 5/1997 | Patel et al. | 365/230.06 |
| 5,901,102 A | * | 5/1999 | Furutani | 365/226 |
| 6,028,793 A | * | 2/2000 | Manstretta et al. | 365/185.23 |
| 6,373,753 B1 | * | 4/2002 | Proebsting | 365/189.09 |
| 7,257,031 B2 | * | 8/2007 | Darrer | 365/185.23 |
| 7,307,896 B2 | * | 12/2007 | Doyle et al. | 365/189.09 |
| 8,218,378 B2 | * | 7/2012 | Arsovski et al. | 365/189.11 |

* cited by examiner

*Primary Examiner* — Gene Auduong (57) ABSTRACT

Devices and circuits for row driver architectures that can improve an existing row driver circuit including a boosting capacitor and a level shifter circuit. For example, the improvement can include a decoupling inverter that decouples the level shifter from the boosting capacitor, which can reduce the time for the row driver to turn on and drive appropriate voltages to the matrix array.

20 Claims, 8 Drawing Sheets

ROW DRIVER CIRCUIT FOR NAND MEMORIES INCLUDING A DECOUPLING INVERTER

FIELD OF THE DISCLOSURE

This disclosure generally relates to techniques and circuits for a flash memory as a non-volatile memory device, and more particularly to a row driver circuit for a flash memory.

BACKGROUND

A NAND memory array typically consists of several strings of memory cells connected in series. Each string of memory cells typically includes a source select transistor SST to selectively connect the string to a common source line SL, and a drain select transistor DST to selectively connect the string to a bitline BL<i>.

Figure 2:
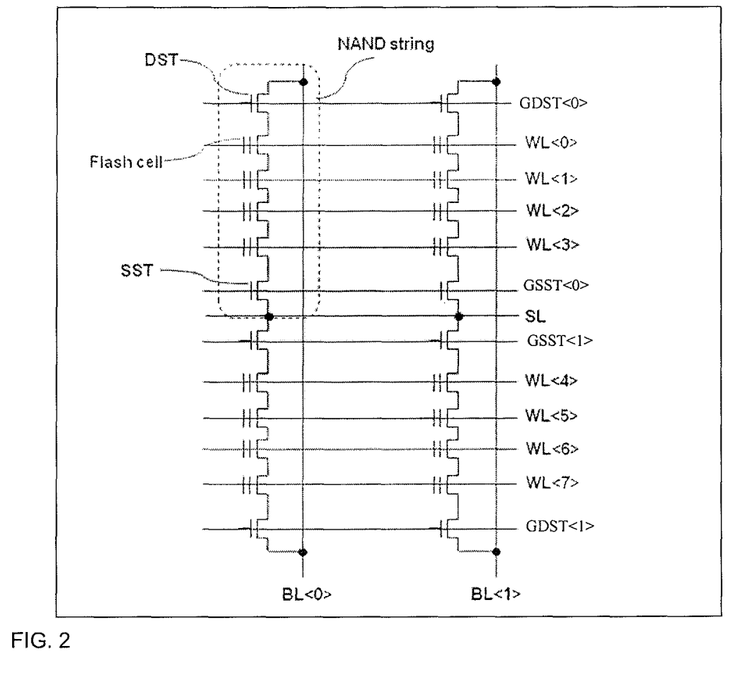
FIG. 2 illustrates exemplary cell strings in a NAND memory array.

For example, FIG. 2 shows a simple NAND memory array that consists of four strings with each string having four memory cells connected in series. The four strings are connected through their respective drain select transistors DSTs to the two bitlines, BL<0> and BL<1>, and through their respective source select transistors SSTs to the common source line SL. The two strings in the upper part share the drain select transistor gate line GDST and the source select transistor gate line GSST, as well as the memory cell gate lines, which are called wordlines WL. The GDST is a line that is connected to a gate of the drain selector transistor DST, and the GSST is a line that is connected to a gate of the source select transistor SST.

The two strings in the lower part also share the same structure. The strings that share the same GDST and GSST lines build a block, and accordingly, there are two blocks in the memory array shown in FIG. 2.

Further, as shown in FIG. 2 the strings in the upper left corner and the lower left corner share the bitline BL<0> whereas the strings in the upper right corner and the lower right corner share the bitline BL<1>. The strings that share a common bitline can be referred to as being stacked on each other.

A block in a NAND memory array typically includes a couple of GDSTs and GSSTs and a total number of wordlines WLs enclosed between them, while this total number of WLs represents the total number of physical cells in a string. This number is typically 32 but may be higher.

In order to perform various operations on a NAND memory array, for example, a read/program or an erase operation, a single memory cell to which the desired operation is directed can be selected among other memory cells in the memory array. A row driver circuit is the circuit used in selecting a single target cell in the memory array. In order to select a target cell in the memory array, a bitline that the target cell is connected to, a block in which the target cell is placed, and a wordline that the target cell is connected to can be selected. By selecting these three characteristics with which each memory cell is associated—the bitline, the block and the wordline—a memory cell in the matrix array can be singled out. In other words, each memory cell in the matrix array has a unique combination of these three characteristics—the bitline, the block and the wordline.

A target bitline, a target block and a target wordline can be selected by performing the following steps:

(i) select a bitline by applying an appropriate voltage BLSEL on the desired bitline while applying a different voltage BLUNSEL on the other bitlines;

(ii) select a block by activating the related drain select transistor gate line GDST and the related source select transistor gate line GSST. This lets the voltage applied on the selected bitline pass through the drain select transistor DST to the string as well as lets the common source line SL connect to the string through the source select transistor SST; and (iii) select a wordline by biasing it at a predetermined voltage VXSEL while biasing the remaining unselected wordlines at a voltage that would be suitable to turn on the related connected cells in order to bias the drain of the selected memory cell to the BLSEL voltage, by making a short circuit between the node and the bitline. This voltage that is used for unselected wordlines is referred to as VXPASS.

A row driver is involved in the third step above and used to drive appropriate voltages on wordlines in a block with which the row driver is associated.

Furthermore, depending on the type of operation that a target cell is subjected to—for example, a read, program, or erase operation—different voltages are driven on each wordline WL, drain select transistor gate line GDST, and source select transistor gate line GSST.

Figure 3:
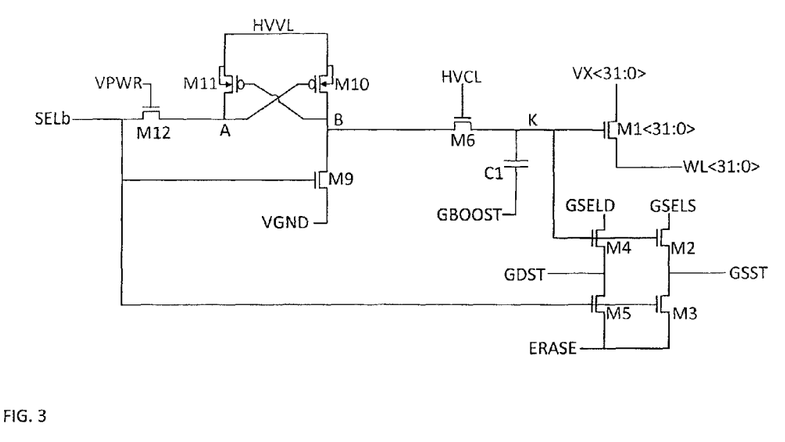
FIG. 3 illustrates exemplary circuit architecture of state-of-art row driver.

Presently, there are several row driver circuits available in the art, which aim to drive appropriate voltages on WLs, GDST lines and GSST lines during various operations. An exemplary architectural scheme of the state-of-art row driver is shown in FIG. 3, which includes a boosting capacitor and a level shifter. The boosting capacitor can be used to allow high voltages to pass onto the wordlines, and the level shifter can be used to transform the power in the input stage of the row driver.

Further, in designing a circuit for a row driver, the size can be a factor to consider as it is generally desirable for a flash memory to be as small as possible. The height of a row driver circuit is typically fixed by technological restrictions or requirements such as the height of the strings in the matrix array. On the other hand, certain characteristics can be altered such as the planar area that is occupied by the row driver circuit. Accordingly, the planar area can be minimized so as to make the size of the final circuit as integrated on silicon as small as possible.

One way to minimize the planar area that would be occupied by the row driver circuit is to use a minimum number of transistors. Therefore, it is generally desirable to design a row driver circuit that would not only have a fast and stable performance but also achieve such performance level with a minimum number of transistors.

FIG. 3 shows exemplary circuit architecture for the state-of-art row driver including a boosting capacitor and an isolating pass transistor. M12, M9, M6, M1<i>, M2, M3, M4 and M5 are ultra high voltage n-type transistors. M10 and M11 are ultra high voltage p-type transistors. C1 is a boosting capacitor of ultra high voltage type that is connected to the driving circuit, node B, through pass transistor M6 which is used to isolate C1 during the boosting stage. M12, M9, M11 and M10 form a level shifter circuit, which is used to shift the voltage level Vpwr on input line SELb to a high voltage level HVV on the output node, which can be either (A) or (B), wherein HVV is the high voltage level of line HVVL. A first switch, not shown and which is not part of the invention, drives the HVVL line at two different voltages: a low voltage equal to Vpwr level, and a high voltage, equal to HVV. On the other hand, a second switch, which is not shown in the figure, drives line HVCL connected to the gate of M6 to a low voltage level equal to Vpwr or to a high voltage level equal to HVC, wherein the high voltage level HVC can be higher or equal to the voltage level HVV. M6 is a decoupling switch that can disconnect C1 and the circuit on its right side from node B.

In this embodiment, the level shifter circuit is enabled when the voltage level of line HVVL is at Vpwr. This helps the p-type transistors M10 and M11 to be sized with the minimal length. As explained above, the level shifter circuit is formed by M9, M10, M11 and M12, wherein M9 and M12 are n-type transistors and M10 and M11 are p-type transistors. The maximum gate-source voltage Vgs of the n-type transistors M9 and M12 is Vpwr. On the other hand, the maximum Vgs voltage of the p-type transistors M10 and M11 is "HVVL-V(A)" or "HVVL-V(B)." For example, the maximum Vgs of the p-type transistors M10 and M11 is HVVL, which occurs when node A or B is grounded. Thus, when HVVL is at Vpwr, the "voltage strength" for n-type and p-type transistors is the same. Further to ensure that the level shifter can flip in response to SELb transition, the size of the p-type transistors M10 and M11 may be drawn to about the same size as that of the n-type transistors M9 and M12. Thus, letting the level shifter circuit be enabled when HVVL is at Vpwr helps to minimize the size of the transistors M9~M12.

Instead, if the level shifter is made to be enabled when HVVL is at a higher voltage than Vpwr, i.e., HVV, "the voltage strength" of the p-type transistors, which forms a pull-up section, becomes greater than that of the n-type transistors, which forms a pull-down section. For example in FIG. 3, the pull-up section M10-M11 would become too strong with respect to the pull-down section M9-M12, and as a consequence the shifting of the input signal SELb may not be successfully translated into the shifting of voltage levels on nodes A and B. In this case, to restore the balance between the pull-up section M10-M11 and the pull-down section M9-M12, the length L of the p-type transistors or the width W of the n-type transistors shall be incremented, which results in increasing the area on silicon that would be occupied by the level shifter circuit.

In the embodiment depicted in FIG. 3, SELb is a logical signal whose input can range from 0V to Vpwr. Signal SELb works as a control signal of the whole row driver circuit: if the row driver is in an unselected block, SELb is at Vpwr, and if the row driver is in a selected block, SELb is at 0V. In other words, if SELb is at Vpwr, the row driver is configured to not drive any voltages onto wordlines WLs, and if SELb is at 0V, the row driver is configured to drive appropriate voltages onto wordlines WLs.

As said, voltage levels HVV and HVC represent high voltage levels, each being greater than Vpwr. Lines HVVL and HVCL as shown in FIG. 3 take as input a voltage selectable in a range between Vpwr to HVV, provided that HVV is less than HVC. VX<i> represent voltages, each of which is to be applied to either selected or unselected wordlines. GSELD and GSELS represent voltages, each of which is to be applied to lines GDST and GSST in the associated memory block. Signal ERASE is a logical signal whose input can range from 0V to Vpwr. ERASE is at a logical high state when the voltage level of ERASE is at Vpwr, and at a logical low state when the voltage level of ERASE is at 0V. ERASE is at the logical high state when an erase operation is on-going and remains otherwise at the logical low state.

GBOOST is a boosting line that outputs whichever is higher between voltage VSEL and voltage VPASS during pulse read or pulse program stages in a read/program operation. GBOOST helps to boost node K to elevate towards a voltage that is higher than HVV during the pulse read or pulse program stages. GBOOST remains at ground voltage in other stages of a read/program operation. GBOOST remains at ground voltage during an erase operation as well.

HVVL, HVCL, VX<i>, GSELD, GSELS and GBOOST lines can be controlled by a uC unit inside the NAND memory, which can control the whole system of a NAND memory. An exemplary uC unit is shown in block 5 in FIG. 1.

Voltages on different lines can evolve as the row driver goes through different stages of an operation. FIG. 5b shows an exemplary waveform of voltages representing how different voltages evolve during different stages of a read/program operation. FIG. 5e shows an exemplary waveform of voltages representing how different voltages evolve during different stages of an erase operation. The following paragraphs discuss these evolutions in more detail.

An exemplary operation of the row driver circuit is explained when the block is unselected. That the block is unselected means that no operation is to be performed on the corresponding wordlines of the block. This condition can be achieved by the row driver circuit failing to drive voltages onto the corresponding wordlines. In other words, the row driver circuit may leave the voltages on each of the corresponding wordlines floating.

When the block is unselected, a control signal of the row driver SELb is set at Vpwr. Then, M12 is turned off, and M9 is turned on. Until the level shifter has completely commuted, lines HVVL and HVCL are kept biased at Vpwr. With SELb stable at Vpwr level, node B is tied to ground, A is tied to HVVL, which is kept at Vpwr, and node K is kept at ground via M6, since GBOOST is at 0V during the input stage. Then, M1<i> is turned off resulting in wordlines WL<i> left floating.

Further, M4 and M2 are turned off at this point, and M5 and M3 have their gates connected to SELb which is at Vpwr. At this point, the two following scenarios are possible:
(1) If ERASE is at 0V, GDST and GSST lines are kept at ground, erasing the DST and SST cells; or
(2) If ERASE is at Vpwr, GDST and GSST are left floating, not erasing the DST and SST cells.

Once the level shifter has commuted, line HVVL can be raised to high voltage HVV from Vpwr, and line HVCL can be raised to high voltage HVC from Vpwr, while node K remains at ground.

An operation of the row driver circuit is explained when the block is selected for a read/program operation. An exemplary waveform of voltage levels and transistor states during this operation is shown in FIG. 5b. When the corresponding block is selected, SELb takes an input voltage at 0V. Then, node A is tied to ground via M12, M9 is left floating, and node B rises to the voltage level of line HVVL, which is still kept at Vpwr voltage. This turns on the level shifter circuit. During this input stage of a read or program operation, GBOOST line is kept at ground until the level shifter has commuted, and node K is boosted so as to be ready for the pulse program or pulse read stages.

After the level shifter has commuted with node B being pulled up to line HVVL, which is still kept at Vpwr, line HVVL can rise from Vpwr to the high voltage level at HVV. In other words, only after the level shifter has commuted, line HVVL can rise to the high voltage HVV, which in turn can charge node K to the high voltage, provided that the high voltage HVV is lower than the high voltage HVC reduced by the threshold voltage of transistor M6. That is, node K is generally charged to the lower of (1) the high voltage HVV, and (2) the high voltage HVC reduced by the threshold voltage of transistor M6. For example, when HVC>HVV+threshold voltage of transistor M6, node K is charged to HVV voltage, as shown in the k-node pre-charge stage in FIG. 5b.

After node K is elevated to the high voltage HVV, line HVCL is driven down from the high voltage level HVC to Vpwr. This can turn off transistor M6 and, accordingly, can isolate node K from the level shifter circuit. GBOOST line is then activated, which consequently can boost up the node K. Then, node K can turn on transistors M1<63:0> in order to pass voltages VSEL and VPASS from VX<i> lines onto wordlines WLs.

An operation of the row driver circuit is hereby explained when the block is selected for an erase operation. An exemplary waveform of voltage levels and transistor states during this erase operation is illustrated in FIG. 5e. ERASE signal is set at Vpwr. A successful erase operation means biasing the associated wordlines WLs at 0V. This can be achieved by keeping the line HVVL at Vpwr and the line HVCL at the voltage level that would be sufficient to short nodes B and K, wherein both nodes are to be shorted at the voltage Vpwr. Then, Vx<i> lines can be biased at ground, and thus worldliness WLs can be biased at ground through transistors M1<63:0>. During the erase operation, GDST and GSST lines are left floating. M5 and M3 are turned off since they have their gate voltages at ground potential. M4 and M2 are turned on since they have their gate voltages at Vpwr. By biasing GSELD and GSELS lines at Vpwr voltage, GDST and GSST lines can charge to the voltage that equals Vpwr reduced by the threshold voltage of M4 and M2. From this point onwards, lines GDST and GSST can be raised due to the coupling effects of the array well.

However, this state-of-art row driver circuit can be subject to several limitations. First, as remarked earlier, it is generally desirable to design a row driver circuit with a minimal planar area. One typical way to minimize the area occupied by the row driver circuit is to use minimally-sized transistors.

As explained above, the size of the transistors in the row driver circuit can be minimized by keeping the voltage line HVVL at Vpwr when input signal SELb is being shifted by the level shifter, the level shifter being the circuit consisted of transistors M11, M10, M9 and M12. For example, if line HVVL is not kept at Vpwr, the pull-up section M10-M11 would be too strong with respect to the pull-down section M9-M12, and as a consequence the shifting of the input signal SELb may not be successfully translated into the shifting of voltage levels on nodes A and B.

Another limitation to this state-of-art row driver is that capacitor C1 needs to be connected to node B when the level shifter is commuting (i.e. when the SELb is changing state) and line HVVL is evolving to HVV voltage, in order for a stable performance of the level shifter circuit. Without this connection of C1 to node B, the level shifter circuit can enter an undetermined state that can ultimately compromise the correct behaviour of the row driver circuit as a whole.

For example, if capacitor C1 is connected to node B, capacitor C1 starts to charge as soon as node B starts to rise from Vpwr to high voltage HVV as line HVVL starts to rise from Vpwr to high voltage HVV. With C1 connected to node B during the input stage, and SELb set at 0V (corresponding block is selected), node A becomes tied to ground, and node B is pulled up to line HVVL, which is at Vpwr. Then, line HVVL starts to rise from Vpwr to high voltage HVV. Node B follows the rise, and provided that line HVCL is sufficiently high to turn on transistor M6 (i.e. voltage HVC>HVV), C1 starts to charge as a result of the capacitive discharge from node B.

If, however, C1 is not connected to node B during the initial phase, the level shifter can enter the above-mentioned undetermined state. C1 can be disconnected during the initial phase by keeping line HVCL at Vpwr, which results in transistor M6 being turned off after voltage on node K reaches Vpwr reduced by the threshold voltage of M6. Then, capacitor C1 can remain disconnected from node B until line HVVL reaches its steady state at the high voltage HVV. When this occurs, the level shifter can enter the above-mentioned undetermined state, specifically due to line HVCL reaching its steady state at the high voltage HVC, thereby turning on transistor M6. This undetermined state is hereby explained in more detail, and an exemplary waveform of voltage levels of node B and node K showing this undetermined state is in FIG. 5d.

If capacitor C1 is disconnected from node B during the initial phase by maintaining line HVCL at Vpwr potential until line HVVL has commuted to its high voltage level HVV, M6 remains turned off. Once line HVVL has commuted to the high voltage, line HVCL is driven to high voltage HVC, and then capacitor C1 and node B are connected through transistor M6 that has been turned on by line HVCL. However, such abrupt connection of C1 to node B can be dangerous, since C1 is charged at the low voltage level Vpwr reduced by threshold voltage of M6 until line HVCL is turned on, little parasitic capacitance of node B can be rapidly discharged as soon as line HVCL is turned on, because of the charge sharing between node B and the big capacitor C1 on node K. This capacitive discharge may result in shorting node B and node K to each other at a low voltage level that can become at near ground potential. Then, it can be difficult to predict the voltages on node B and node K, and thereby node B and node K will enter the undetermined state, as shown in FIG. 5d.

In this undetermined condition, line HVVL in the level shifter circuit is still kept at the high voltage level HVV, which results in a too strong pull-up section, M10-M11, and a too weak pull-down section, M12-M9, in the level shifter. With this unbalanced pull-up and pull-down sections, the level shifter may fail in recovering the correct voltage levels on node B and node K. This failure of the level shifter circuit may lead to failure of the row driver circuit as a whole, being unable to bias the associated matrix array correctly. Further, when this occurs, there can be a huge current consumption from line HVVL to ground. Then, the voltage level of line HVVL may start to drop, and as a consequence the whole circuitry connected to line HVVL may suffer. This whole phenomenon is referred to as the above-mentioned undetermined state to which the state-of-art row driver can enter when line HVVL is left reaching its high voltage level at HVV before line HVCL reaches its high voltage level at HVC. In order to prevent such condition occurring in the state-of-art row driver, it is necessary for C1 to be connected to node B during the commutation of the level shifter circuit.

On the other hand, the need of maintaining C1 connected to node B during the initial commuting phase of the level shifter can result in the following inefficiencies with respect to the performances of the state-of-art row driver circuit.

(1) First, a delay may be unavoidable for node B to complete its voltage commutation, and hence the time needed for the row driver to turn on may be slow. That is because the capacitive couplings between node B and capacitor C1 can delay the commutation of node B. For example, the transition of line HVVL from Vpwr to HVV needs to be sufficiently slow so as to enable the voltage on node K to follow the voltage on node B through transistor M6. If this condition is not met, the charge of node K will likely suffer a delay with respect to the charge of node B, and this asymmetry could lead to the undetermined state again. As a result, if the commutation of line HVVL and node B is slowed down, the commutation of node K is slowed down as well, which delays the charging of capacitor 1 and thereby slows the turning-on process of the row driver circuit as a whole.

(2) Second, the condition that line HVCL reach the high voltage level HVC before line HVVL reaches its high voltage level HVV may be required to avoid an undesirable operation of the row driver circuit, i.e., entering into the above-mentioned undetermined state. As explained above with FIG. 5d, the voltage levels on node B and node K become unstable when the condition is not met. This is a restriction in terms of the high voltage management, especially during the power-on phase when all the voltages are evolving to their steady state values.

In sum, the state-of-art row driver is subject to several limitations, which may in turn make the row driver circuit as a whole inefficient, especially with respect to the high voltage management, the risk associated with the level shifter circuit of entering the undetermined state for failing to prepare the high voltage state HVC before HVVL reaches its high voltage state HVV during the initial commuting phase, and the delay associated with the commutation of the level shifter circuit, which is caused by the capacitive couplings between C1 and node B during the commutation of the level shifter circuit during the initial commuting phase.

SUMMARY

The present disclosure is directed to ways to mitigate the above mentioned problems. For example, the performance of the state-of-art row driver can be improved by reducing the time needed for the row driver to turn on and/or by reducing the coupling between the level shifter nodes and the big capacitor C1 so as to lower the risk that the row driver would enter the undetermined state. This can be achieved, for example, by adding a decoupling inverter.

Further, the improvement to the state-of-art row driver can be achieved with a minimum area loss. For example, the decoupling inverter that is added to the state-of-art row driver for the improved performance can consist of only two transistors.

According to an embodiment, a device comprises a reference potential node (VGND) supplied with a reference potential; first, second, third, and fourth nodes (HVVL, SELb, B and C); a first transistor (M11) having a source-drain path coupled between the first and second nodes and a gate coupled to the third node; a second transistor (M10) having a source-drain path coupled between the first and third nodes and a gate coupled to the second node; a third transistor (M9) having a source-drain path coupled between the third node and the reference potential node and a gate coupled to the second node; a fourth transistor (M8) having a source-drain path coupled between the first and fourth nodes and a gate coupled to the second node; and a fifth transistor (M7) having a source-drain path coupled between the fourth node and the reference potential node and a gate coupled to the second node. In an embodiment, the second node may be to change in level between the reference potential and a first potential, and the first node may be configured to change in level between the first potential and a second potential that is greater than the first potential.

In this embodiment, the first node may change from the first potential to the second potential when or after the second node takes the reference potential.

In this embodiment, each of the first, second and fourth transistors can be a first channel type transistor whereas each of the third and fifth transistors can be a second channel type transistor.

According to another embodiment, a device comprises a non-volatile memory cell coupled to a word line and a word line driver driving the word line to a selection level. The word line driver comprises a reference potential node (VGND) supplied with a reference potential; first, second, third and fourth nodes (HVV, SELb, B and C); a first transistor (M11) having a source-drain path coupled between the first and second nodes and a gate coupled to the third node; a second transistor (M10) having a source-drain path coupled between the first and third nodes and a gate coupled to the second node; a third transistor (M9) having a source-drain path coupled between the third node and the reference potential node and a gate coupled to the second node; a fourth transistor (M8) having a source-drain path coupled between the first and fourth nodes and a gate coupled to the second node; a fifth transistor (M7) having a source-drain path coupled between the fourth node and the reference potential node and a gate coupled to the second node; a capacitor having a first end coupled to the fourth node and a second end supplied with a boosting signal; a voltage line supplied with the selection level; and a sixth transistor having a source-drain path coupled between the word line and the voltage line and a gate coupled to the first end of the capacitor.

DETAILED DESCRIPTION

The claimed subject matter will now be described herein with reference to illustrative embodiments. Those skilled in the art will recognize that many alternative embodiments can be accomplished using the teachings of this disclosure and that the claimed subject matter is not limited to the embodiments illustrated here for explanatory purposes.

Described are methods and circuits for row driver architectures that can increase the performance of the row driver, for example, by reducing the time needed for the row driver to turn on and/or by reducing the charge coupling between the level shifter nodes and a boosting capacitor so as to lower the risk that the row driver would enter the undetermined state. This can be achieved, for example, by adding a decoupling inverter. Various modifications and embodiments are possible as well, as described below and as would be readily apparent to one of ordinary skill in the art in view of the teachings of this application.

Figure 4:
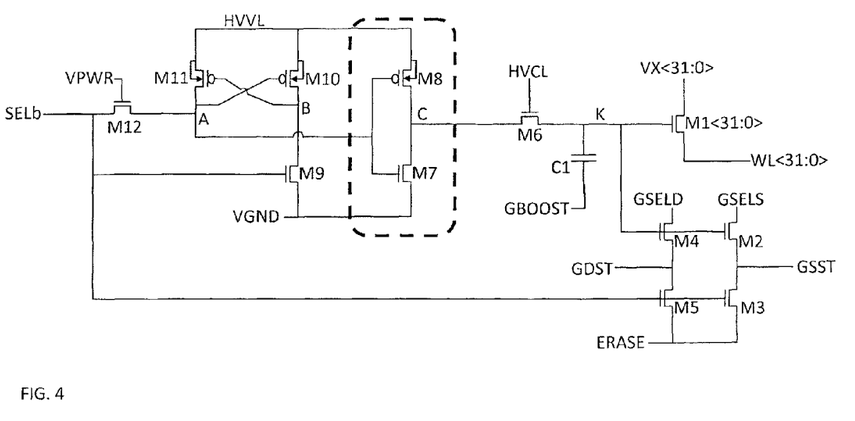
FIG. 4 illustrates exemplary circuit architecture of state-of-art row driver with a decoupling inverter.

FIG. 4 illustrates exemplary circuit architecture for the state-of-art row driver that employs a decoupling inverter. The decoupling inverter is formed by two additional transistors. The two ultra high voltage transistors M7 and M8 are placed so that their gates are connected to node A, and their outputs are connected to node C. Node C is then connected to transistor M6. The inverter formed by transistors M7 and M8 can decouple the level shifter from transistor M6 and boosting capacitor C1, and the level shifter remains decoupled from transistor M6 and capacitor C1 throughout all stages of an operation.

The decoupling inverter formed by transistors M7 and M8 can work as a buffer that allows line HVCL to commute to its high voltage level HVC independently from the evolution of line HVVL without affecting in any manner the evolution of nodes A and B. Any charge sharing will now be between nodes C and K without affecting nodes A and B. This decoupling can prevent the parasitic effects on the level shifter that have existed with the state-of-art row driver circuit due to the charge couplings between the level shifter circuit and any other commuting lines including a huge capacitive load of node K.

First, the decoupling of the level shifter from capacitor C1 can eliminate several limitations that have existed with the state-of-art row driver circuit, for example, the requirement that line HVCL reach the high voltage level HVC before line HVVL reaches its high voltage level HVV. This requirement has existed to prevent nodes B and K from being shorted to each other, which occurs when node B is at HVV level and node K is at near ground potential, thereby prevent the level shifter circuit from entering the above-mentioned undetermined state. However, with the decoupling inverter placed in between the level shifter and node K, even if line HVCL is enabled to turn on transistor M6 only after line HVVL has already reached its high voltage level at HVV, nodes B and K are not shorted to each other because nodes B and K are isolated or decoupled by the decoupling inverter.

Figure 5A:
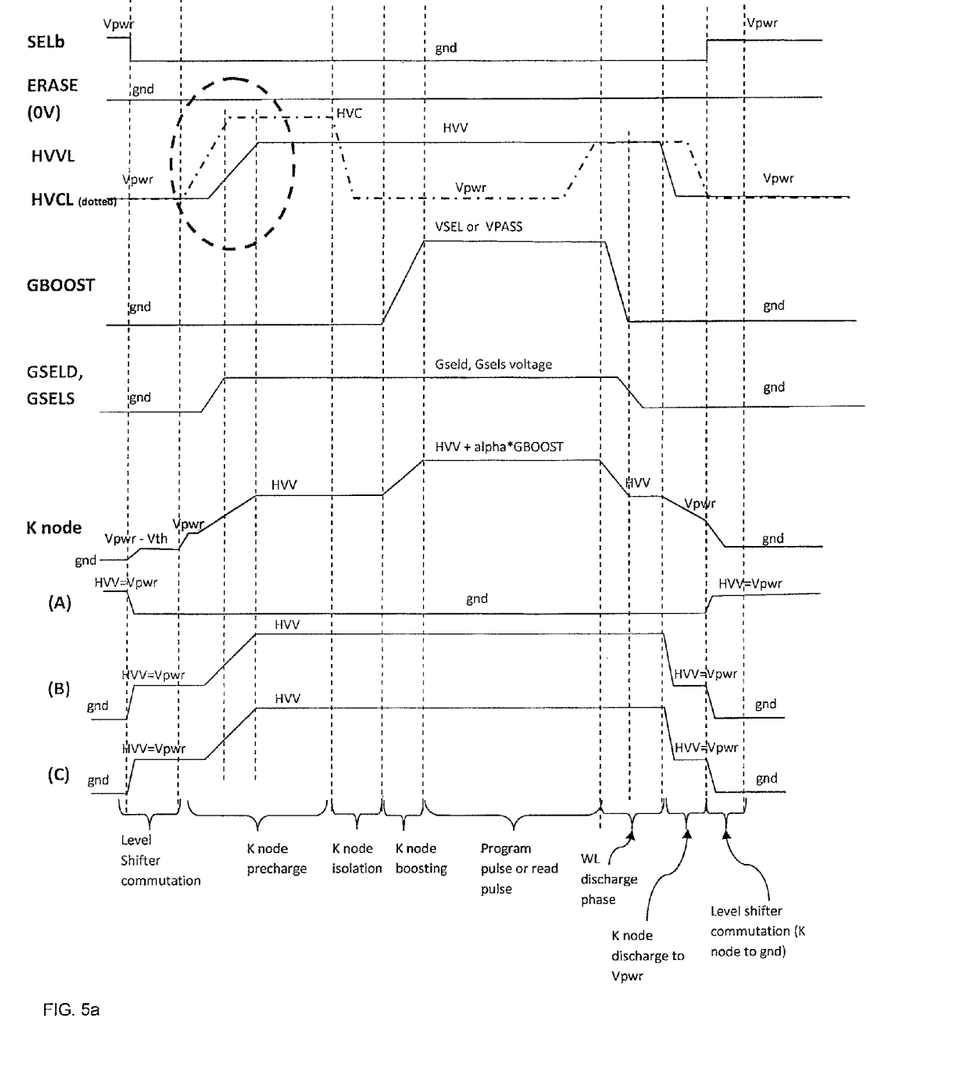
FIG. 5a depicts an exemplary waveform of voltage levels and transistor states according to an example during a read, verify or program operation, when the row driver circuit includes a decoupling inverter.
Figure 5B:
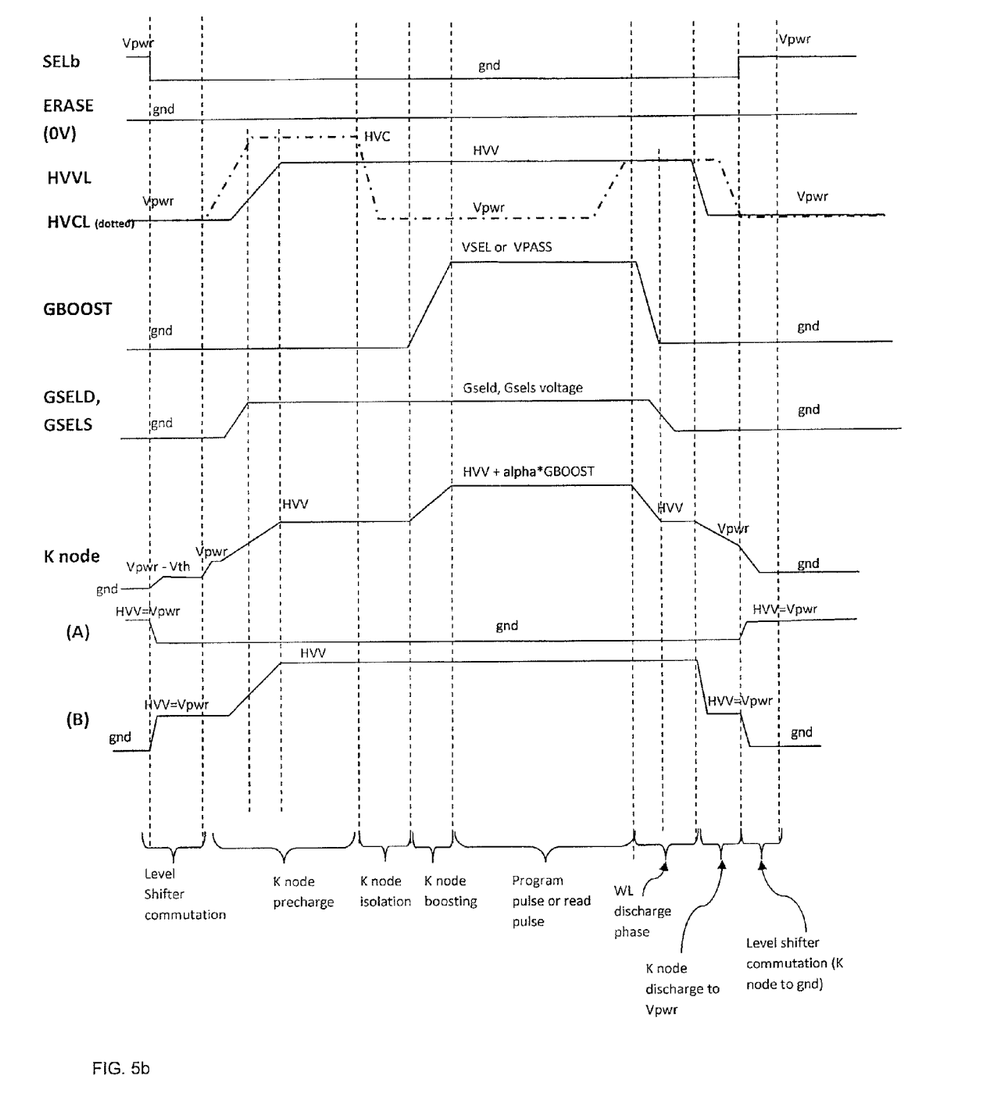
FIG. 5b depicts an exemplary waveform of voltage levels and transistor states according to an example during a read, verify or program operation, when the row driver circuit does not include a decoupling inverter.
Figure 5C:
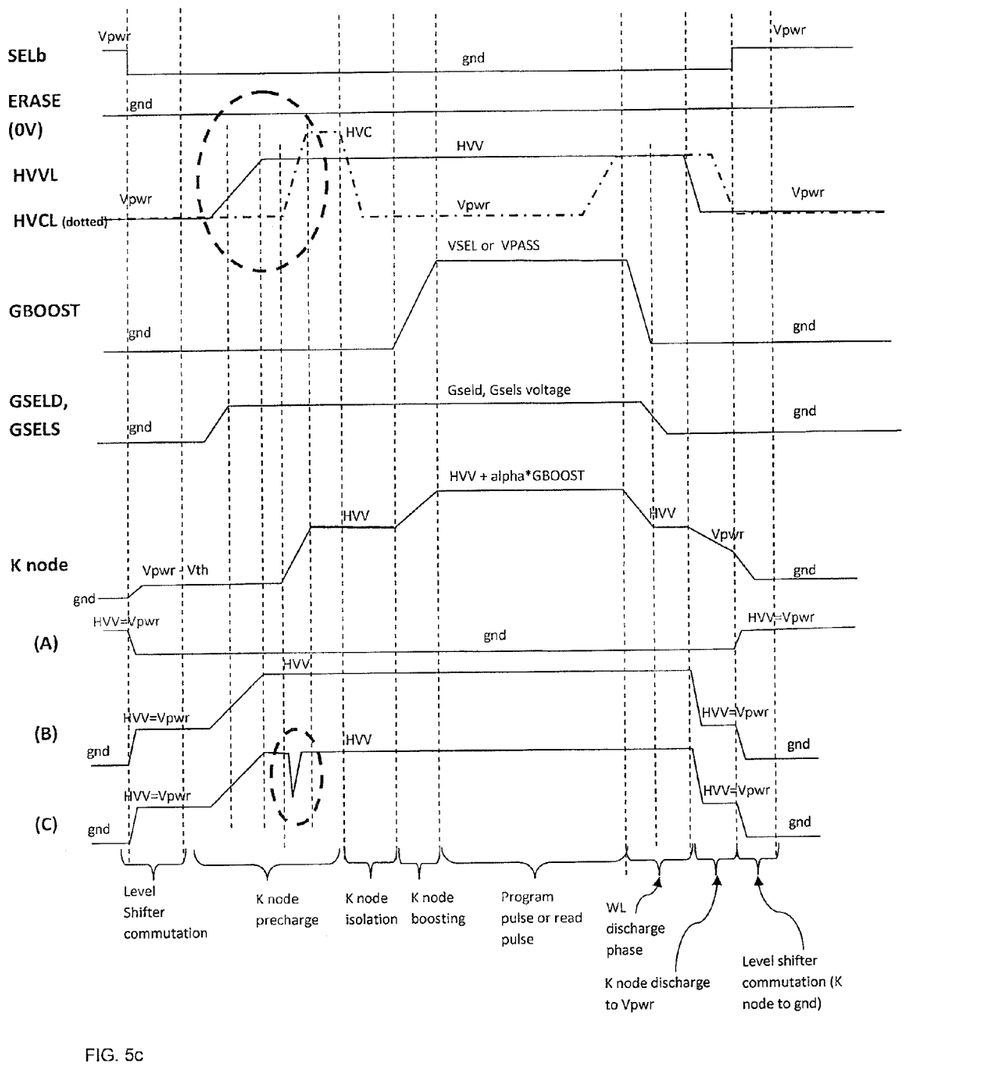
FIG. 5c depicts an exemplary waveform of voltage levels and transistor states according to another example during a read, verify or program operation, when the row driver circuit includes a decoupling inverter.
Figure 5D:
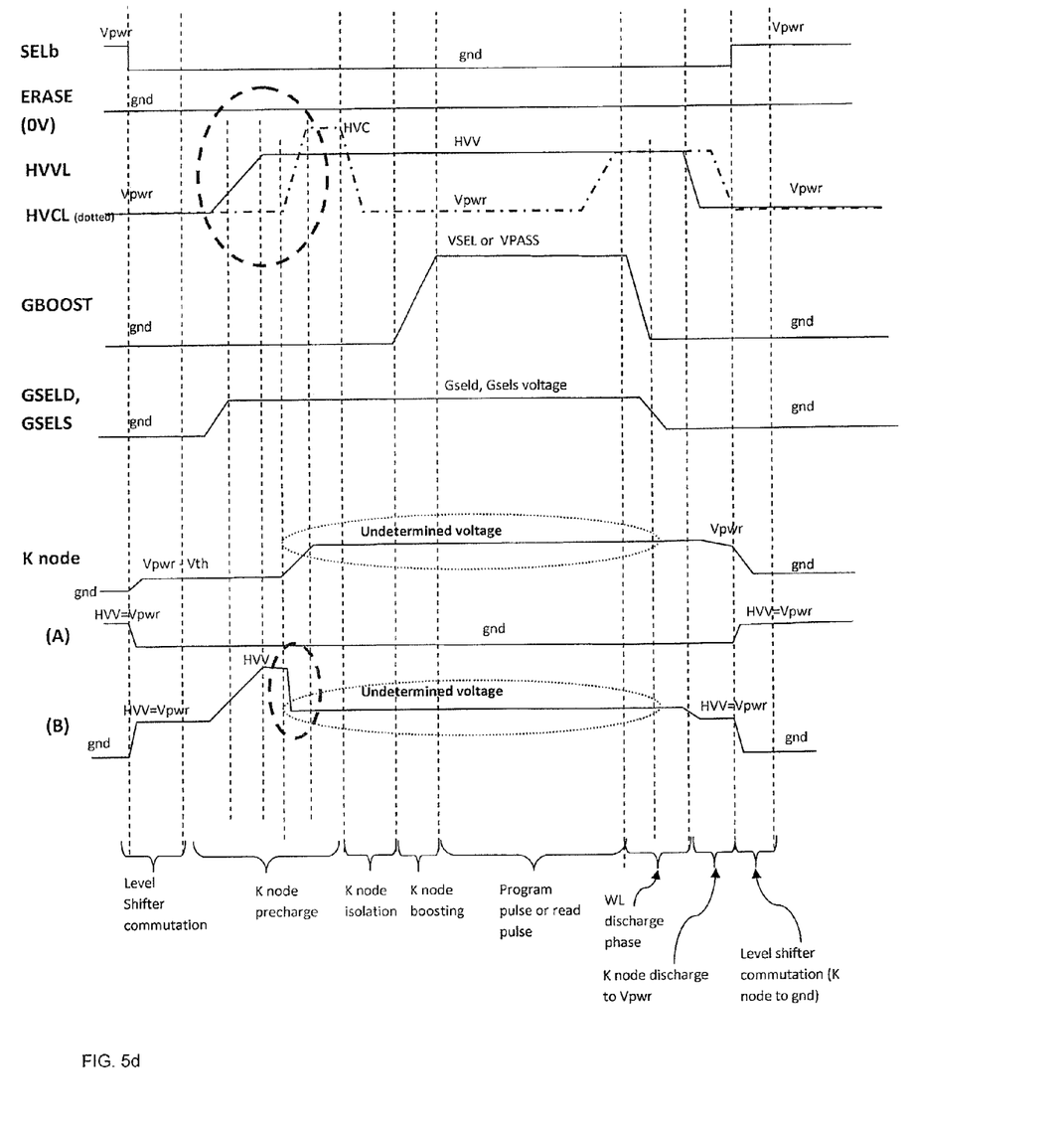
FIG. 5d depicts an exemplary waveform of voltage levels and transistor states according to another example during a read, verify or program operation, when the row driver circuit does not include a decoupling inverter.
Figure 5E:
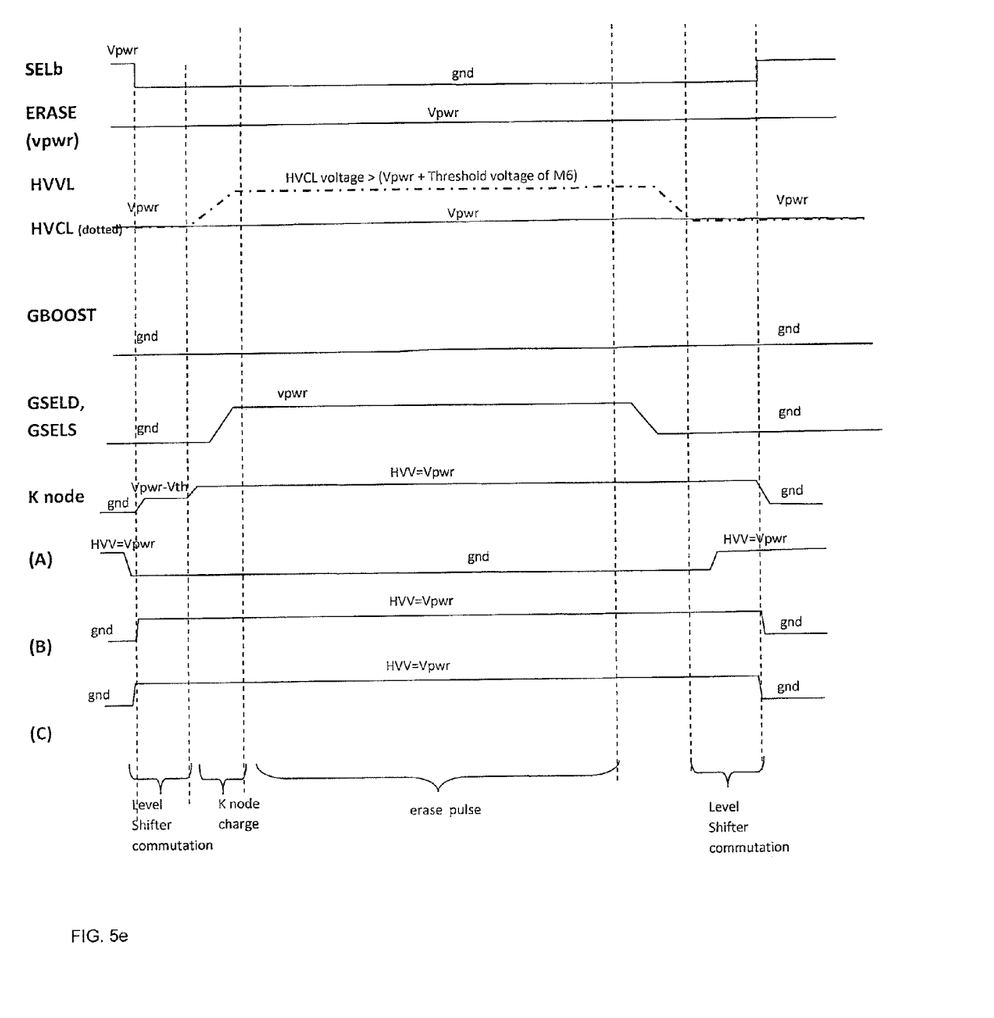
FIG. 5e depicts an exemplary waveform of voltage levels and transistor states according to an example during an erase operation, both when the row driver circuit does and does not include a decoupling inverter.

For example, FIGS. 5a through 5d show this advantage. FIGS. 5a and 5b respectively represent voltage levels and transistor states of the state-of-art row driver circuit without a decoupling inverter (FIG. 5b) and the row driver circuit with a decoupling inverter (FIG. 5a), when node K is connected to node B (FIG. 5b) or node C (FIG. 5a) before line HVVL ramps up from Vpwr to its high voltage HVV. This condition results in line HVCL reaching its high voltage state HVC before line HVVL can reach its high voltage state HVV. In this case, as explained above the state-of-art row driver without a decoupling inverter can produce stable voltages on node B of the level shifter, as shown in FIG. 5b. Also, the row driver with a decoupling inverter produces stable voltages on node B of the level shifter, as shown in FIG. 5a.

FIGS. 5c and 5d respectively represent voltage levels and transistor states of the state-of-art row driver without a decoupling inverter (FIG. 5d) and the row driver circuit with a decoupling inverter (FIG. 5c) when node K is connected to node C (FIG. 5c), or node B (FIG. 5d) after line HVVL has already ramped up from Vpwr to its high voltage HVV. This condition results in line HVCL reaching its high voltage state HVC after HVV has already reached its high voltage state HVV. In this case, as explained above the state-of-art row driver without a decoupling inverter produce unstable voltages on node B, and consequently both node B of the level shifter and node K connected to node B enter the undetermined state, as shown in FIG. 5d. Specifically, the fall of the voltage level on node B is due to the abrupt connection made between node B and capacitor C1 charged at a low potential (Vpwr reduced by the voltage threshold of M6), which causes abrupt charge couplings between them. Since line HVVL has already reached its high voltage state HVV, the level shifter is not likely to recover the correct voltage level on node B, thereby compromising the correct behavior of the row driver circuit as a whole.

On the other hand, even when line HVCL reaches its high voltage state at HVC after line HVVL has already reached its high voltage state at HVV, the row driver circuit with a decoupling inverter produces stable voltages on node B, as shown in FIG. 5c. Specifically, node B can maintain a stable voltage level at HVV despite the abrupt charge couplings between node C and capacitor C1; node B and node K can avoid entering the undetermined state even when there is an abrupt charge coupling with capacitor C1. Further, the glitch on node C that is caused by the abrupt charge couplings between node C and capacitor C1 can be recovered by the buffer circuit M7-M8, which decouples the level shifter from capacitor C1. Thus, the operation of the level shifter circuit may be unaffected by the timings of the voltage-level evolutions of line HVVL and line HVCL.

Accordingly, the decoupling of the level shifter from capacitor C and node K may prevent the level shifter circuit from entering the undetermined state, and consequently a need to decouple rising phases of high voltage line HVVL and high voltage line HVCL can be eliminated. A high flexibility in controlling the high voltage on line HVVL and on line HVCL may be ensured with the state-of-art row driver circuit including a decoupling inverter.

Second, the row driver with the decoupling inverter can prevent unnecessary delays or slowing down in the commutation of the level shifter and thus fasten the row driver circuit as a whole. To illustrate this point, the operation of the row driver circuit with a decoupling inverter as compared to that of the row driver without the decoupling inverter is explained. The respective operations assume that the associated memory block of the row driver circuit is selected for a read/program operation.

When the block is selected, control signal SELb is set at 0V to enable the row driver. Node A is tied to ground via M12, M9 is left floating, and node B is pulled up to line HVVL which is kept at Vpwr. As line HVVL starts to commute from Vpwr to the high voltage level HVV, node B starts to follow the rise of line HVVL.

In the case without the decoupling inverter, as soon as line HVCL is set at Vpwr, M6 is turned on so as to allow a charge sharing between node B and capacitor C1 in node K. In fact, the commutation of the level shifter starts with both line HVVL and line HVCL set at Vpwr, and thus the charge sharing between node B and capacitor C1 occurs from the beginning of the commutation of the level shifter. After the commutation phase, line HVCL is driven at high voltage HVC, keeping node B shorted to node K. For example, the transition of line HVVL from Vpwr to HVV needs to be sufficiently slow so as to enable the voltage on node K to follow the voltage on node B through the transistor M6. If this condition is not met, the charge of node K will likely suffer a delay with respect to the charge of node B, and this asymmetry can lead to the undetermined state again. As a result, if the commutation of line HVVL and node B is slowed down, the commutation of node K is slowed down as well, which delays the charging of capacitor C1 and thereby slows the turning-on process of the row driver circuit as a whole.

On the other hand, with the decoupling inverter that decouples the level shifter that includes node A and node B from capacitor C1 connected to node K, the charge sharing between node B and node K is prevented. Thus, any delay in or slowing down of the commutation of line HVVL and node B, caused by the charge sharing between node B and node K, may be eliminated. This can speed up the commutation of line HVVL and the charging of node K as well as the turning-on of the row driver circuit as a whole.

Furthermore, if unnecessary delays associated with the commutation of the level shifter can be prevented, the current consumption during the commutation phase can also be reduced. Also, prevention of this possible delay in the commutation phase can lower the risk associated with the level shifter entering the above-mentioned undetermined state due to failing to decouple rising phases of the high voltage lines during the input stage, i.e., let line HVCL complete the rising phase before line HVVL completes its rising phase.

Accordingly, the decoupling inverter that can isolate nodes A and B from the huge capacitive load of node K enables, among other, two things: (i) connect node K to node C with the line HVCL at the high voltage level from the beginning of the commutation without affecting the speed of the level shifter commutation (i.e. the HVVL line can be rise to HVV without slowing down the commutation), and (ii) connect node K to node C whenever there is a need to do so without risking the level shifter entering the undefined zone, since no spurious voltage variation will occur on nodes A and B. In other words, the load C1 can now be connected to the circuit on the left side of transistor M6 independently from the evolving voltage value of the line HVVL.

The row driver circuit with the decoupling inverter can gain most advantages during the power-on phase of the row driver. The power-on phase of the row driver is when all the high voltages are evolving and hence the correct behavior of each evolving voltages becomes susceptible to varying conditions such as technology corners, temperatures, supply voltages and charge couplings with other evolving voltages. If each evolving voltage in the level shifter can be isolated from the other evolving voltages outside the level shifter, the risk of compromised behavior due to the susceptibility to the above-mentioned varying conditions can be lowered.

However, the decoupling inverter isolates nodes A and B from the huge capacitive load of node K at all times. In other words, the level shifter is decoupled from the huge capacitive load of node K throughout all stages of all operations and thus can provide a high flexibility in controlling the row driver circuit not only during the power-on phase but also during any stage of any operations.

On the other hand, the addition of two transistors M7 and M8 can require a few additional areas on silicon, especially when the p-channel transistor M8 is configured to share the same source as other p-channel transistors M10 and M11, as shown in FIG. 4. But, this area loss is not likely to be substantial. Assume that all the transistors are drawn to their minimum size and the total number of the transistors is 73 as is the case in FIG. 4. Then, the area loss is 2/73, which rounds to about only 2.7%. However, the actual area loss is far less than 2.7% because the size of boosting capacitor C1 is substantially greater than the size of all other transistors, thereby making the actual area-loss ratio substantially smaller than 2/73. Therefore, the disclosed subject matter can improve the state-of-art row driver with only a minimal area loss.

FIG. 5e illustrates exemplary waveform of voltage levels and transistor states in an erase operation, both when the row driver circuit is with and without a decoupling inverter. Both circuits behave in the same way as explained in the earlier section. The waveform indicating voltage levels on node C is only for the row driver circuit with a decoupling inverter because node C does not exist in the row driver circuit without a decoupling inverter.

Figure 1:
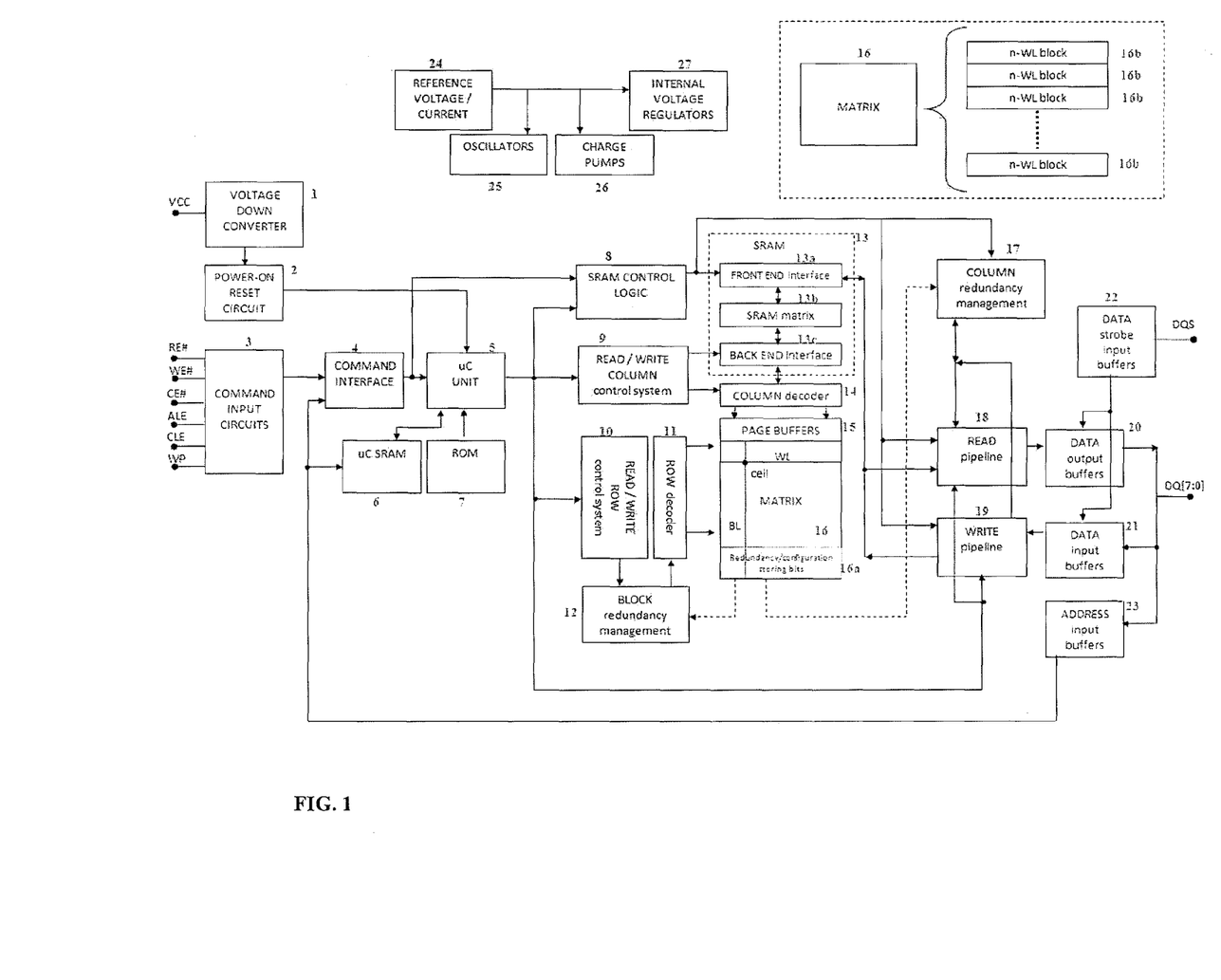
FIG. 1 illustrates an exemplary block scheme of a NAND flash memory.

FIG. 1 illustrates various components of an exemplary NAND flash memory. One of ordinary skill in the art can understand how the various components and functions are interrelated. One of ordinary skill in the art can understand how to implement the disclosed techniques and circuits in a flash memory such as is disclosed in this figure. In particular, implementation of the disclosed techniques and circuits can involve row driver block 11. The high voltage generated by regulating block 27 is applied to row driver block 11 through the control system contained in block 10. The whole system is controlled by uC unit 5.

One skilled in the relevant art will recognize that many possible modifications and combinations of the disclosed embodiments can be used, while still employing the same basic underlying mechanisms and methodologies. The foregoing description, for purposes of explanation, has been written with references to specific embodiments. However, the illustrative discussions above are not intended to be exhaustive or to limit the disclosure to the precise forms disclosed. Many modifications and variations can be possible in view of the above teachings. The embodiments were chosen and described to explain the principles of the disclosure and their practical applications, and to enable others skilled in the art to utilize the disclosure and various embodiments with various modifications as suited to the particular use contemplated.

Furthermore, while this specification contains many specifics, these should not be construed as limitations on the scope of what is being claimed or of what may be claimed, but rather as descriptions of features specific to particular embodiments. Certain features that are described in this specification in the context of separate embodiments can also be implemented in combination in a single embodiment. Conversely, various features that are described in the context of a single embodiment can also be implemented in multiple embodiments separately or in any suitable subcombination. Moreover, although features may be described above as acting in certain combinations and even initially claimed as such, one or more features from a claimed combination can in some cases be excised from the combination, and the claimed combination may be directed to a subcombination or variation of a subcombination.

What is claimed is:

1. A device comprising:
   a driving circuit for a first word line comprising:
   a reference potential node supplied with a reference potential;
   first, second, third and fourth nodes;
   a first transistor having a source-drain path coupled between the first and second nodes and a gate coupled to the third node;
   a second transistor having a source-drain path coupled between the first and third nodes and a gate coupled to the second node;
   a third transistor having a source-drain path coupled between the third node and the reference potential node and a gate coupled to the second node;
   a fourth transistor having a source-drain path coupled between the first and fourth nodes and a gate coupled to the second node;
   a fifth transistor having a source-drain path coupled between the fourth node and the reference potential node and a gate coupled to the second node; and a pass transistor having a source-drain path between a voltage line and the first word line and having a gate coupled to the fourth node.

2. The device as claimed in claim 1, wherein the second node is configured to change in level between the reference potential and a first potential that is greater than the reference potential, and the first node is configured to change in level between the first potential and a second potential that is greater than the first potential.

3. The device as claimed in claim 2, wherein the first node changes from the first potential to the second potential when or after the second node takes the reference potential.

4. The device as claimed in claim 3, wherein the first node returns from the second potential to the first potential during the second taking the reference potential.

5. The device as claimed in claim 3, wherein each of the first, third and fifth transistors is rendered conductive and the each of the second and fourth transistors is rendered non-conductive when the second node takes the reference potential.

6. The device as claimed in claim 5, wherein the third and fourth nodes are changed toward the second potential through the second and fourth transistors, respectively, when the first node changes to the second potential.

7. The device as claimed in claim 1, wherein each of the first, second and fourth transistor is of a first channel type and each of the third and fifth transistors is of a second channel type.

8. The device as claimed in claim 1, further comprising a sixth transistor and a fifth node, the sixth transistor having a source-drain path coupled between the second node and the fifth node and a gate supplied with a first potential, the fifth node being connected in common to the source-drain path of the first transistor and the gates of the second, fourth and fifth transistors.

9. The device as claimed in claim 1, further comprising a capacitor having a first end coupled to the fourth node and a second end supplied with a boosting signal.

10. The device as claimed in claim 9, further comprising a transfer transistor having a source-drain path inserted between the fourth node and the capacitor and a gate supplied with a control signal.

11. The device as claimed in claim 10, wherein the control signal changes in level between the first potential and a third potential that is greater than the second potential.

12. The device as claimed in claim 11, wherein the control signal changes from the first potential toward the third potential prior to the first node changing from the first potential toward the second potential.

13. The device as claimed in claim 1, further comprising:
a memory string comprising a drain side transistor coupled to a bit line, a source side transistor coupled to a source line, and a plurality of memory cells coupled between the drain side transistor and the source side transistors, each of the memory cells having a gate coupled to an associated one of word lines including the first word line, and wherein the third node of the driving circuit is not connected directly to any of the word lines.

14. A device comprising:
a non-volatile memory cell coupled to a word line; and
a word line driver driving the word line to a selection level, the word line driver comprising;
a reference potential node supplied with a reference potential;
first, second, third and fourth nodes;
a first transistor having a source-drain path coupled between the first and second nodes and a gate coupled to the third node;
a second transistor having a source-drain path coupled between the first and third nodes and a gate coupled to the second node;
a third transistor having a source-drain path coupled between the third node and the reference potential node and a gate coupled to the second node;
a fourth transistor having a source-drain path coupled between the first and fourth nodes and a gate coupled to the second node;
a fifth transistor having a source-drain path coupled between the fourth node and the reference potential node and a gate coupled to the second node;
a capacitor having a first end coupled to the fourth node and a second end supplied with a boosting signal;
a voltage line supplied with the selection level; and
a sixth transistor having a source-drain path coupled between the word line and the voltage line and a gate coupled to the first end of the capacitor.

15. The device as claimed in claim 14, wherein the word line driver further comprises a seventh transistor having a source-drain path inserted between the fourth node and the first end of the capacitor and a gate supplied with a control signal.

16. The device as claimed in claim 14, wherein the second node is configured to change in level between the reference potential and a first potential that is greater than the reference potential, and the first node is configured to change in level between the first potential and a second potential that is greater than the first potential.

17. The device as claimed in claim 16, wherein the first node changes from the first potential to the second potential when the second takes the reference potential.

18. The device as claimed in claim 17, wherein the first node returns from the second potential to the first potential during the second taking the reference potential.

19. The device as claimed in claim 18, wherein the boosting signal changed from an initial level to a boosting level during the first node taking the second potential.

20. The device as claimed in claim 19, wherein the boosting signal returns from the boosting level to the initial level during the first node taking the second potential.

* * * * *